United States Patent
Chu et al.

(10) Patent No.: US 10,847,643 B2
(45) Date of Patent: Nov. 24, 2020

(54) ENHANCEMENT MODE HEMT DEVICE AND METHOD OF FORMING THE SAME

(71) Applicant: Nuvoton Technology Corporation, Hsinchu (TW)

(72) Inventors: Kuei-Yi Chu, Hsinchu (TW); Heng-Kuang Lin, Hsinchu (TW)

(73) Assignee: Nuvoton Technology Corporation, Hsinchu (TW)

( * ) Notice: Subject to any disclaimer, the term of this patent is extended or adjusted under 35 U.S.C. 154(b) by 30 days.

(21) Appl. No.: 16/181,367

(22) Filed: Nov. 6, 2018

(65) Prior Publication Data

US 2019/0207021 A1    Jul. 4, 2019

(30) Foreign Application Priority Data

Dec. 28, 2017   (TW) .............................. 106146142 A

(51) Int. Cl.
*H01L 29/778* (2006.01)
*H01L 29/423* (2006.01)
(Continued)

(52) U.S. Cl.
CPC ...... *H01L 29/7787* (2013.01); *H01L 21/0337* (2013.01); *H01L 29/41725* (2013.01);
(Continued)

(58) Field of Classification Search
CPC .......... H01L 29/7787; H01L 29/41725; H01L 29/66462; H01L 21/0337; H01L 29/42316;
(Continued)

(56) References Cited

U.S. PATENT DOCUMENTS

| 8,441,035 B2 | 5/2013 | Hikita et al. |
| 2003/0227027 A1* | 12/2003 | Micovic ................ H01L 29/452 257/192 |

(Continued)

FOREIGN PATENT DOCUMENTS

| CN | 102239551 | 11/2011 |
| TW | 200913077 | 3/2009 |
| TW | 201314891 | 4/2013 |

OTHER PUBLICATIONS

"Office Action of Taiwan Counterpart Application," dated Jan. 29, 2019, p. 1-p. 8.

*Primary Examiner* — Steven H Loke
*Assistant Examiner* — Juanita B Rhodes
(74) *Attorney, Agent, or Firm* — JCIPRNET

(57) ABSTRACT

Provided is an enhancement mode HEMT device including a substrate, a channel layer, a barrier layer, a P-type semiconductor layer, a carrier providing layer, a gate electrode, a source electrode and a drain electrode. The channel layer is disposed on the substrate. The barrier layer is disposed on the channel layer. The P-type semiconductor layer is disposed on the barrier layer. The carrier providing layer is disposed on the sidewall of the P-type semiconductor layer and extends laterally away from the P-type semiconductor layer. The gate electrode is disposed on the P-type semiconductor layer. The source electrode and the drain electrode are disposed on the carrier providing layer and at two sides of the gate electrode. A method of forming an enhancement mode HEMT device is further provided.

19 Claims, 8 Drawing Sheets

(51) Int. Cl.
  *H01L 21/033* (2006.01)
  *H01L 29/66* (2006.01)
  *H01L 29/417* (2006.01)
  *H01L 29/20* (2006.01)
  *H01L 29/06* (2006.01)
  *H01L 29/10* (2006.01)

(52) U.S. Cl.
  CPC .. *H01L 29/42316* (2013.01); *H01L 29/66462* (2013.01); *H01L 29/0657* (2013.01); *H01L 29/1066* (2013.01); *H01L 29/2003* (2013.01)

(58) Field of Classification Search
  CPC ............. H01L 29/1066; H01L 29/0657; H01L 29/2003; H01L 29/0684; H01L 29/778
  See application file for complete search history.

(56) References Cited

U.S. PATENT DOCUMENTS

| | | | |
|---|---|---|---|
| 2008/0296618 A1* | 12/2008 | Suh | H01L 29/432 257/190 |
| 2011/0227093 A1* | 9/2011 | Hikita | H01L 29/41766 257/76 |
| 2013/0099285 A1 | 4/2013 | Hwang et al. | |
| 2015/0021667 A1 | 1/2015 | Liu et al. | |
| 2016/0240646 A1 | 8/2016 | Chiu et al. | |
| 2016/0351685 A1 | 12/2016 | Kondo et al. | |
| 2017/0125562 A1 | 5/2017 | Prechtl et al. | |

* cited by examiner

ENHANCEMENT MODE HEMT DEVICE AND METHOD OF FORMING THE SAME

CROSS-REFERENCE TO RELATED APPLICATION

This application claims the priority benefit of Taiwan application no. 106146142, filed on Dec. 28, 2017. The entirety of the above-mentioned patent application is hereby incorporated by reference herein and made a part of this specification.

BACKGROUND OF THE INVENTION

Field of Invention

The present invention relates to a semiconductor device and a method of forming the same, and more generally to an enhancement mode high electron mobility transistor (HEMT) device and a method of forming the same.

Description of Related Art

In recent years, group III-V compound semiconductor based HEMT devices have been widely applied in high power electronic devices due to their low resistance, high breakdown voltage and fast switch speed, etc.

HEMT devices can be divided into depletion mode or normally on transistor devices, and enhancement mode or normally off transistor devices. The enhancement mode transistor devices have been drawn high attention in the industry because of the added safety and because they are easier to control with simple and low cost drive circuits.

SUMMARY OF THE INVENTION

Accordingly, the present invention provides an enhancement mode HEMT device, in which a carrier providing layer is disposed on the barrier layer or the channel layer outside of the gate region, so as to effectively increase the output current and therefore improve the device performance.

The present invention provides an enhancement mode HEMT device that includes a substrate, a channel layer, a barrier layer, a P-type semiconductor layer, a carrier providing layer, a gate electrode, a source electrode and a drain electrode. The channel layer is disposed on the substrate. The barrier layer is disposed on the channel layer. The P-type semiconductor layer is disposed on the barrier layer. The carrier providing layer is disposed on a sidewall of the P-type semiconductor layer and extends laterally away from the P-type semiconductor layer. The gate electrode is disposed on the P-type semiconductor layer. The source electrode and the drain electrode are disposed on the carrier providing layer and at two sides of the gate electrode.

According to an embodiment of the present invention, an aluminum content of the carrier providing layer is greater than an aluminum content of the barrier layer.

According to an embodiment of the present invention, the carrier providing layer has a single-layer structure.

According to an embodiment of the present invention, the carrier providing layer has a multi-layer structure, and an aluminum content of the carrier providing layer is gradually reduced away from the channel layer.

According to an embodiment of the present invention, the carrier providing layer includes InAlGaN, AlGaN, AlInN, AlN, GaN or a combination thereof.

According to an embodiment of the present invention, a thickness of the carrier providing layer on a the sidewall of the P-type semiconductor layer is less than a thickness of the carrier providing layer on a top of the barrier layer.

According to an embodiment of the present invention, the enhancement mode HEMT further includes a dielectric layer disposed on the carrier providing layer and between the gate electrode and the P-type semiconductor layer.

According to an embodiment of the present invention, the carrier providing layer is in contact with the barrier layer.

According to an embodiment of the present invention, a thickness of the barrier layer below the P-type semiconductor layer is greater than a thickness of the barrier layer at two sides of the P-type semiconductor layer.

According to an embodiment of the present invention, the P-type semiconductor layer has an inclined sidewall.

According to an embodiment of the present invention, the P-type semiconductor layer has a substantially vertical sidewall.

According to an embodiment of the present invention, the carrier providing layer is in contact with the channel layer.

According to an embodiment of the present invention, a thickness of the channel layer below the barrier layer is greater than a thickness of the channel layer at two sides of the barrier layer.

According to an embodiment of the present invention, the P-type semiconductor layer has an inclined sidewall.

The present invention further provides an enhancement mode HEMT device that includes the following steps. A channel layer, a barrier layer and a P-type semiconductor layer are sequentially formed on a substrate. A mask layer is formed on the P-type semiconductor layer. A pattern of the mask layer is transferred to the P-type semiconductor layer. A carrier providing layer is formed on the substrate and covers a sidewall of the P-type semiconductor layer. A source electrode and a drain electrode are formed at two sides of the P-type semiconductor layer. A gate electrode is formed on the P-type semiconductor layer.

According to an embodiment of the present invention, the pattern of the mask layer is further transferred to a portion of the barrier layer.

According to an embodiment of the present invention, the pattern of the mask layer is further transferred to the barrier layer and a portion of the channel layer.

According to an embodiment of the present invention, a method of forming the carrier providing layer includes performing an epitaxial regrowth process.

According to an embodiment of the present invention, an aluminum content of the carrier providing layer is greater than an aluminum content of the barrier layer.

According to an embodiment of the present invention, the method further includes forming a dielectric layer before forming the source electrode and the drain electrode and after forming the carrier providing layer.

In view of the above, a carrier providing layer is disposed on the barrier layer or the channel layer outside of the gate region, so as to effectively increase the output current and therefore improve the device performance. Besides, the method of the invention has simple process steps and can greatly enhance the flexibility of the epitaxial growth and the device design.

In order to make the aforementioned and other objects, features and advantages of the present invention comprehensible, a preferred embodiment accompanied with figures is described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1A:
FIG. 1A to FIG. 1F are schematic cross-sectional views of a method of forming an enhancement mode HEMT device according to some embodiments of the present invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1A to FIG. 1F are schematic cross-sectional views of a method of forming an enhancement mode HEMT device according to some embodiments of the present invention.

Referring to FIG. 1A, a channel layer 102, a barrier layer 104 and a P-type semiconductor layer 106 are sequentially formed on a substrate 100. In an embodiment, the substrate 100 includes sapphire, Si, SiC or GaN. In an embodiment, the channel layer 102 includes a group III nitride or a group III-V compound semiconductor material. For example, the channel layer 102 includes GaN. Besides, the channel layer 102 can be a doped or undoped layer. In an embodiment, the method of forming the channel layer 102 includes performing an epitaxial growth process.

In an embodiment, a buffer layer 101 is optionally disposed between the substrate 100 and the channel layer 102. The buffer layer 101 is configured to alleviate a lattice constant difference and a thermal expansion coefficient difference between the substrate 100 and the channel layer 102. In an embodiment, the buffer layer 101 includes a group III nitride or a group III-V compound semiconductor material. For example, the buffer layer 101 includes InAlGaN, AlGaN, AlInN, InGaN, AlN, GaN a combination thereof. Besides, the buffer layer 101 can have a single-layer or multi-layer structure. In an embodiment, the method of forming the buffer layer 101 includes performing an epitaxial growth process.

In an embodiment, the barrier layer 104 includes a group III nitride or a group III-V compound semiconductor material. For example, the barrier layer 104 includes InAlGaN, AlGaN, AlInN, AlN a combination thereof. In an embodiment, the barrier layer 104 includes $Al_xGa_{1-x}N$, wherein x is from 0 to 1, such as from 0.05 to 0.5, from 0.1 to 0.3 or from 0.2 to 0.4. Besides, the barrier layer 104 can be a doped or undoped layer, and may have a single-layer or multi-layer structure. In an embodiment, the method of forming the barrier layer 104 includes performing an epitaxial growth process.

The P-type semiconductor layer 106 is disposed between the barrier layer 104 and the subsequently formed gate electrode G. The P-type semiconductor layer 106 is configured to form a cut-off region of two-dimensional electron gas (2DEG) or a region with a relatively low electron density. In an embodiment, the P-type semiconductor layer 106 includes a group III nitride or a group III-V compound semiconductor material. For example, the P-type semiconductor layer 106 includes InAlGaN, AlGaN, InGaN, InAlN, GaN, InN or a combination thereof, and is doped with a P-type dopant (such as Mg). In an embodiment, the P-type semiconductor layer 106 can be a P-type GaN layer. In an embodiment, the method of forming the P-type semiconductor layer 106 includes performing an epitaxial growth process.

Figure 1B:
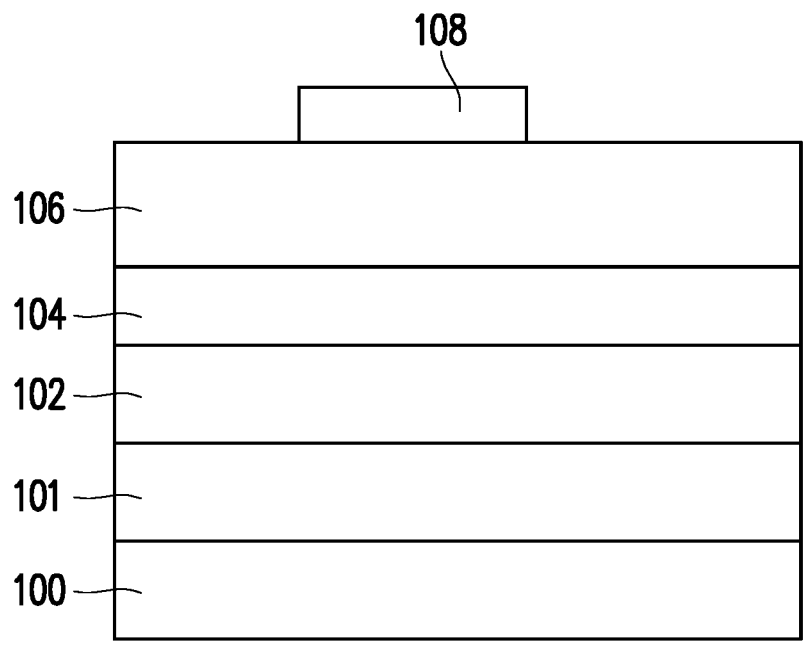

Referring to FIG. 1B, a mask layer 108 is formed on the P-type semiconductor layer 106. In an embodiment, the mask layer 108 includes silicon oxide, silicon nitride, silicon oxynitride or a combination thereof. In an embodiment, the method of forming the mask layer 108 includes depositing a mask material layer on the P-type semiconductor layer 106, and performing a patterning process (e.g., photolithography etching processes) to the mask material layer.

Figure 1C:
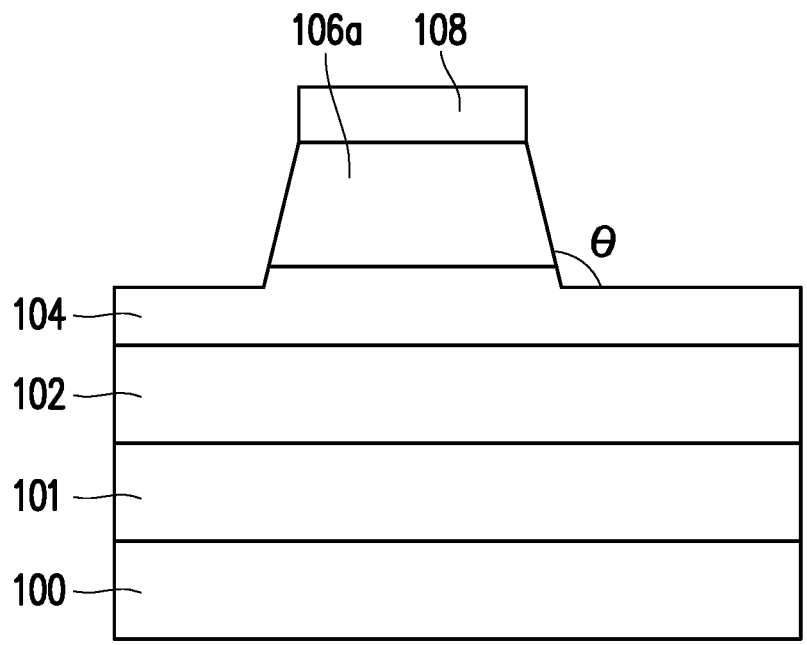

Referring to FIG. 1C, the pattern of mask layer 108 is transferred to the P-type semiconductor layer 106. The pattern transferring process includes generally transferring the shape and/or size of an upper pattern to one or more lower layers. In an embodiment, an etching process is performed by using the mask layer 108 as an etching mask, and thus, the pattern of the mask layer 108 is not only transferred to the P-type semiconductor layer 106, but also transferred to a portion of the barrier layer 104. The etching process includes a dry etching process, a wet etching process or a combination thereof. Upon the pattern transferring process or the etching process, the remaining P-type semiconductor layer 106 is referred to as a P-type semiconductor layer 106a. In an embodiment, after the pattern transferring process or the etching process, the thickness of the barrier layer 104 located below the P-type semiconductor layer 106a is greater than the thickness of the barrier layer 104 located at two sides of the P-type semiconductor layer 106a. In an embodiment, the P-type semiconductor layer 106a has an inclined sidewall. Specifically, the angle θ between the sidewall of the P-type semiconductor layer 106a and the top of the barrier layer 104 is an obtuse angle. For example, the angle θ can be 95, 100, 105, 110, 115, 120, 125, 130, 135, 140, 145, 150, 155, 160, 165, 170, 175 degrees, including any range between any two of the preceding values.

Figure 1D:
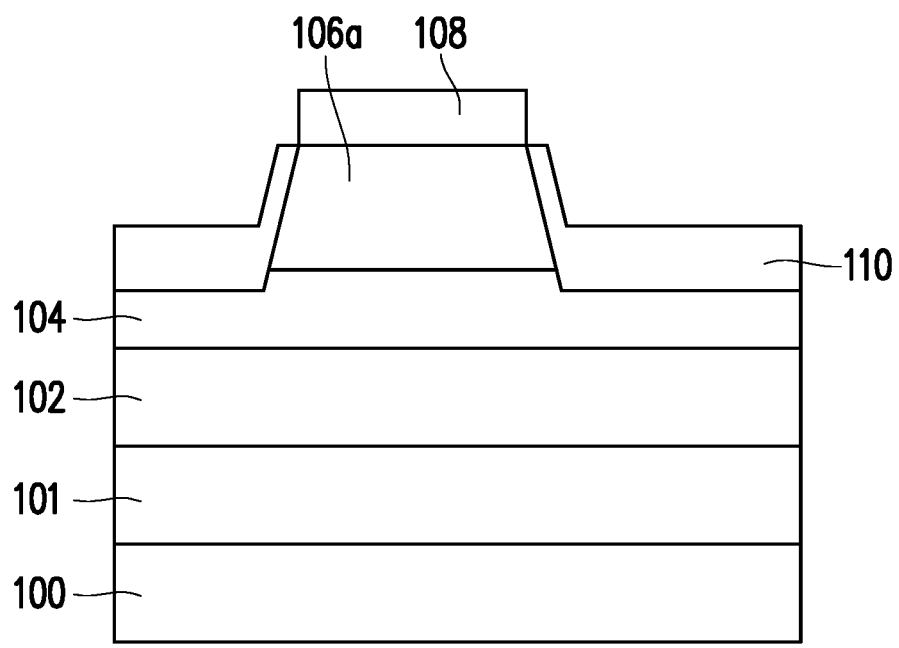

Referring to FIG. 1D, a carrier providing layer 110 is formed on the substrate 100. In an embodiment, the carrier providing layer 110 covers the sidewall of the P-type semiconductor layer 106 and the top of the barrier layer 104 at two sides of the P-type semiconductor layer 106.

In an embodiment, the carrier providing layer 110 includes a group III nitride or a group III-V compound semiconductor material. In an embodiment, the carrier providing layer 110 includes a quaternary nitride, a ternary nitride, a binary nitride or a combination thereof. For example, the carrier providing layer 110 includes InAlGaN, AlGaN, AlInN, AlN, GaN or a combination thereof. In an embodiment, the carrier providing layer 110 includes $Al_yGa_{1-y}N$, wherein y is from 0 to 1, such as from 0.05 to 0.5, from 0.1 to 0.3 or from 0.2 to 0.4. In another embodiment, the carrier providing layer 110 includes $In_{1-x-y}Al_xGa_yN$, wherein x is from 0 to 1, y is from 0 to 1, and x can be from 0.05 to 0.5, from 0.1 to 0.3 or from 0.2 to 0.4. Besides, the carrier providing layer 110 can be a doped or undoped layer. In an embodiment, the carrier providing layer 110 has a single-layer structure.

In an embodiment, the method of forming the carrier providing layer 110 includes performing an epitaxial regrowth process. Specifically, an epitaxial layer is not grown or formed on the top of the P-type semiconductor layer 106a covered by the mask layer 108. Therefore, the sidewall of the P-type semiconductor layer 106a and the top of the barrier layer 104 which are not covered by the mask layer 108 can serve as regrowth surfaces for forming the carrier providing layer 110. In an embodiment, the thickness of the carrier providing layer 110 on the sidewall of P-type semiconductor layer 106a is less than the thickness of the carrier providing layer 110 on the top of the barrier layer 104. The mask layer 108 is then removed after the epitaxial regrowth process.

It is noted that, the carrier providing layer 110 of the invention is configured to provide carriers for the adjacent barrier layer 104, so as to enhance the polarization and carrier concentration of the barrier layer 104 and therefore to further reduce the resistance of the channel layer 102 and improve the output current. In an embodiment, the aluminum content of the carrier providing layer 110 is equal to or greater than the aluminum content of the barrier layer 104. In an embodiment, the barrier layer 104 includes $Al_xGa_{1-x}N$, and the carrier providing layer 110 includes $Al_yGa_{1-y}N$, wherein x is from 0 to 1, y is from 0 to 1, and y is greater than or equal to x. For example, the barrier layer 104 includes $Al_{0.2}Ga_{0.8}N$, and the carrier providing layer 110 includes $Al_{0.3}Ga_{0.7}N$.

In an embodiment, the barrier layer 104 is substantially the same in composition as the carrier providing layer 110. For example, both of them are ternary nitrides with different aluminum contents. In another embodiment, the barrier layer 104 has a composition different from that of the carrier providing layer 110. For example, the barrier layer 104 is a ternary nitride, the carrier providing layer 110 is a quaternary compound, and the aluminum content of each is also different.

Figure 1E:
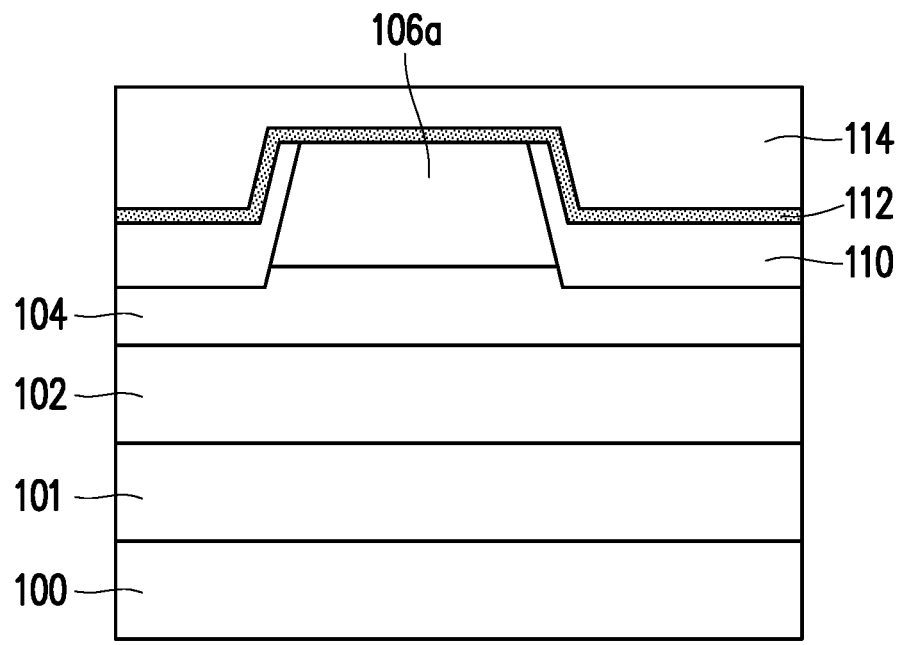

Referring to FIG. 1E, a dielectric layer 112 is optionally formed on the carrier providing layer 110. In an embodiment, the dielectric layer 112 includes aluminum oxide, and the forming method thereof includes performing a suitable deposition process such as a chemical vapour deposition process. Thereafter, a passivation layer 114 is formed on the dielectric layer 112. In an embodiment, the passivation layer 114 includes silicon oxide, and the forming method thereof includes performing a suitable deposition process such as a chemical vapour deposition process.

Figure 1F:
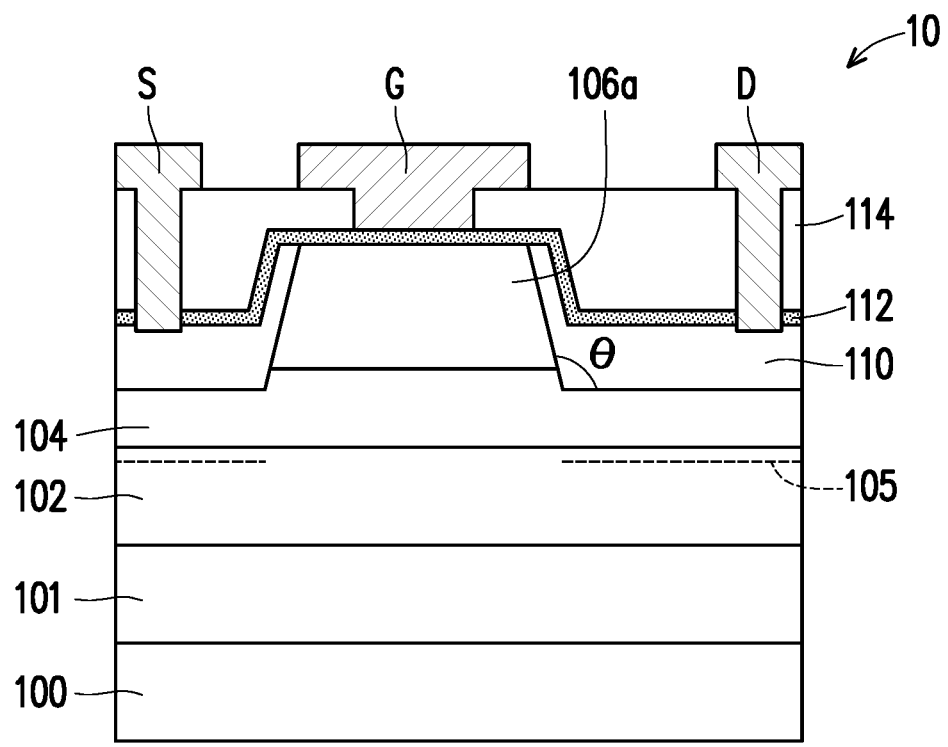

Referring to FIG. 1F, a source electrode S and a drain electrode D are formed at two sides of the P-type semiconductor layer 106a. In an embodiment, the source electrode S and the drain electrode D are disposed on the barrier layer 104 beside the P-type semiconductor layer 106a, penetrate through the passivation layer 114 and the dielectric layer 112, and extend into a portion of the carrier providing layer 110. However, the present invention is not limited thereto. In another embodiment, at least one of the source electrode S and the drain electrode D extends into the channel layer 102 and is electrically connected to a 2DEG 105. In an embodiment, the source electrode S and the drain electrode D include a metal (such as Al, Ti, Ni, Au or an alloy thereof), or a material which can form an Ohmic contact with a group III-V compound semiconductor.

Thereafter, a gate electrode G is formed on the P-type semiconductor layer 106a. In an embodiment, the gate electrode G includes a metal or a metal nitride (such as Ta, TaN, Ti, TiN, W, Pd, Ni, Au, Al or a combination thereof), a metal silicide (such as $WSi_x$), or a material which can form a Schottky contact with a group III-V compound semiconductor. In an embodiment, the gate electrode G is not in physical contact with the P-type semiconductor layer 106a, and the dielectric layer 112 is located between the gate electrode G and the P-type semiconductor layer 106a. In another embodiment, when the formation of the dielectric layer 112 is omitted as appropriate, the gate electrode G directly contacts the P-type semiconductor layer 106a. The enhancement mode HEMT device 10 of the invention is thus completed.

As shown in FIG. 1F, the enhancement mode HEMT device 10 of the invention includes a substrate 100, a channel layer 102, a barrier layer 104, a P-type semiconductor layer 106a, a carrier providing layer 110, a gate electrode G, a source electrode S and a drain electrode D. The channel layer 102 is disposed on the substrate 100. The barrier layer 104 is disposed on the channel layer 102. The P-type semiconductor layer 106a is disposed on the barrier layer 104. The carrier providing layer 110 is disposed on the sidewall of the P-type semiconductor layer 106a and extends laterally away from the P-type semiconductor layer 106a. In an embodiment, the carrier providing layer 110 is formed to have a single-layer structure (as shown in FIG. 1D), and the aluminum content of the carrier providing layer 110 is greater than the aluminum content of the barrier layer 104. In an embodiment, the carrier providing layer 110 contacts the barrier layer 104. In an embodiment, the carrier providing layer 110 is adjacent to the barrier layer 104. In an embodiment, in the pattern transferring process of FIG. 1C, the pattern of the mask layer is transferred to the P-type semiconductor layer and a portion of the barrier layer. Thereafter, the carrier providing layer 110 is formed on the sidewall of the P-type semiconductor layer 106a and extends outwardly on the barrier layer 104, as shown in FIG. 1F. The gate electrode G is disposed on the P-type semiconductor layer 106a. The source electrode S and the drain electrode D are disposed on the carrier providing layer 110 and at two sides of the gate electrode G. In an embodiment, the dielectric layer 112 is disposed on the carrier providing layer 110 and between the gate electrode G and the P-type semiconductor layer 106a.

In above embodiment, the etching depth of the pattern transferring process in FIG. 1C and the film structure of the carrier providing layer forming step in FIG. 1D can be adjusted upon the process requirements to provide various enhancement mode HEMT devices. For example, the etching depth of the pattern transferring process can be down to the channel layer. For example, the carrier providing layer can have a multi-layer structure, and the aluminum content thereof is gradually reduced away from the channel layer.

FIG. 2 to FIG. 10 are schematic cross-sectional views of enhancement mode HEMT devices according to alternative embodiments of the present invention. The enhancement mode HEMT devices 11 to 19 in FIGS. 2 to 10 are similar to the enhancement mode HEMT device 10 in FIG. 1F, so the difference between them is illustrated below, and the similarity is not iterated herein.

Figure 2:
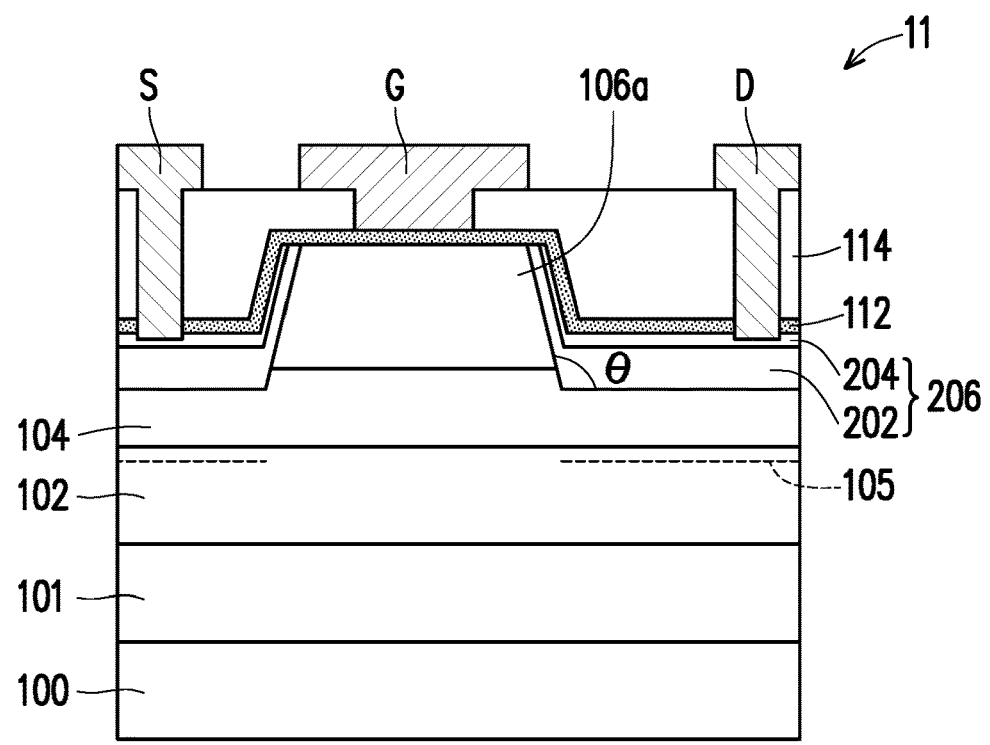
FIG. 2 to FIG. 10 are schematic cross-sectional views of enhancement mode HEMT devices according to alternative embodiments of the present invention.

The enhancement mode HEMT device 11 in FIG. 2 is similar to the enhancement mode HEMT device 10 in FIG. 1F, and the difference between them lies in that, the carrier providing layer 110 of the enhancement mode HEMT device 10 in FIG. 1F has a single-layer structure, while the carrier providing layer 206 of the enhancement mode HEMT device 11 in FIG. 2 has a dual-layer structure. In an embodiment, as shown in FIG. 2, the carrier providing layer 206 includes, from bottom to top, a carrier providing layer 202 and a carrier providing layer 204, and the aluminum content of the carrier providing layer 202 is greater than the aluminum content of the carrier providing layer 204. Besides, the average aluminum content of the carrier providing layer 206 is greater than the aluminum content of the barrier layer 104. In an embodiment, the barrier layer 104 includes $Al_xGa_{1-x}N$, the carrier providing layer 202 includes $Al_yGa_{1-y}N$, and the carrier providing layer 204 includes $Al_zGa_{1-z}N$, wherein x is from 0 to 1, y is from 0 to 1, z is from 0 to 1, y is greater than or equal to x, and y is greater than or equal to z. For example, the barrier layer 104 includes $Al_{0.2}Ga_{0.8}N$, the carrier providing layer 202 includes $Al_{0.3}Ga_{0.7}N$, and the carrier providing layer 204 includes $Al_{0.2}Ga_{0.8}N$. In an embodiment, the thickness of the carrier providing layer 202 is at least 10 times or at least 15 times the thickness of the carrier providing layer 204.

Figure 3:
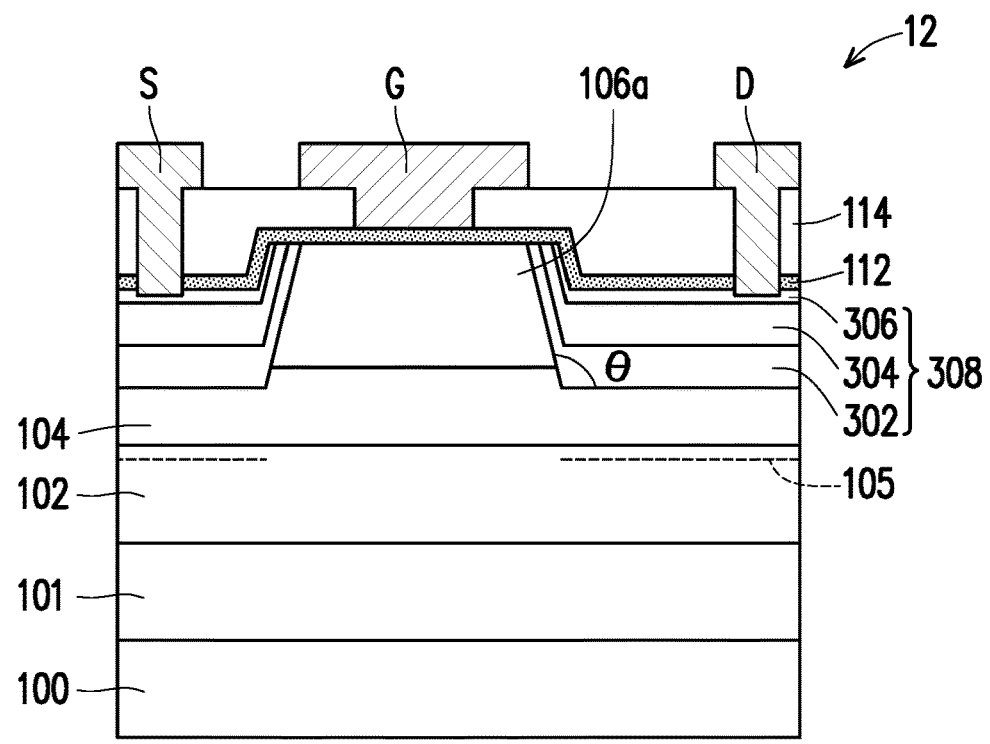

The enhancement mode HEMT device 12 in FIG. 3 is similar to the enhancement mode HEMT device 10 in FIG. 1F, and the difference between them lies in that, the carrier providing layer 110 of the enhancement mode HEMT device 10 in FIG. 1F has a single-layer structure, while carrier providing layer 308 of the enhancement mode HEMT device 12 in FIG. 3 has a tri-layer structure. In an embodiment, as shown in FIG. 3, the carrier providing layer 308 includes, from bottom to top, a carrier providing layer 302, a carrier providing layer 304 and a carrier providing layer 306. The aluminum content of the carrier providing layer 302 is greater than the aluminum content of carrier providing layer 304, and the aluminum content of the carrier providing layer 304 is greater than the aluminum content of the carrier providing layer 306. Besides, the average aluminum content of the carrier providing layer 308 is greater than the aluminum content of the barrier layer 104. In an embodiment, the barrier layer 104 includes $Al_xGa_{1-x}N$, the carrier providing layer 302 includes $Al_yGa_{1-y}N$, the carrier providing layer 304 includes $Al_zGa_{1-z}N$, and the carrier providing layer 304 includes $Al_iGa_{1-i}N$, wherein x is from 0 to 1, y is from 0 to 1, z is from 0 to 1, i is from 0 to 1, y is greater than or equal to x, y is greater than or equal to z, and z is greater than or equal to i. For example, the barrier layer 104 includes $Al_{0.2}Ga_{0.8}N$, the carrier providing layer 302 includes $Al_{0.3}Ga_{0.7}N$, the carrier providing layer 304 includes $Al_{0.2}Ga_{0.8}N$, and the carrier providing layer 306 includes GaN. In an embodiment, the thickness of the carrier providing layer 302 or the carrier providing layer 304 is at least 10 times or at least 15 times the thickness of the carrier providing layer 306.

Figure 4:
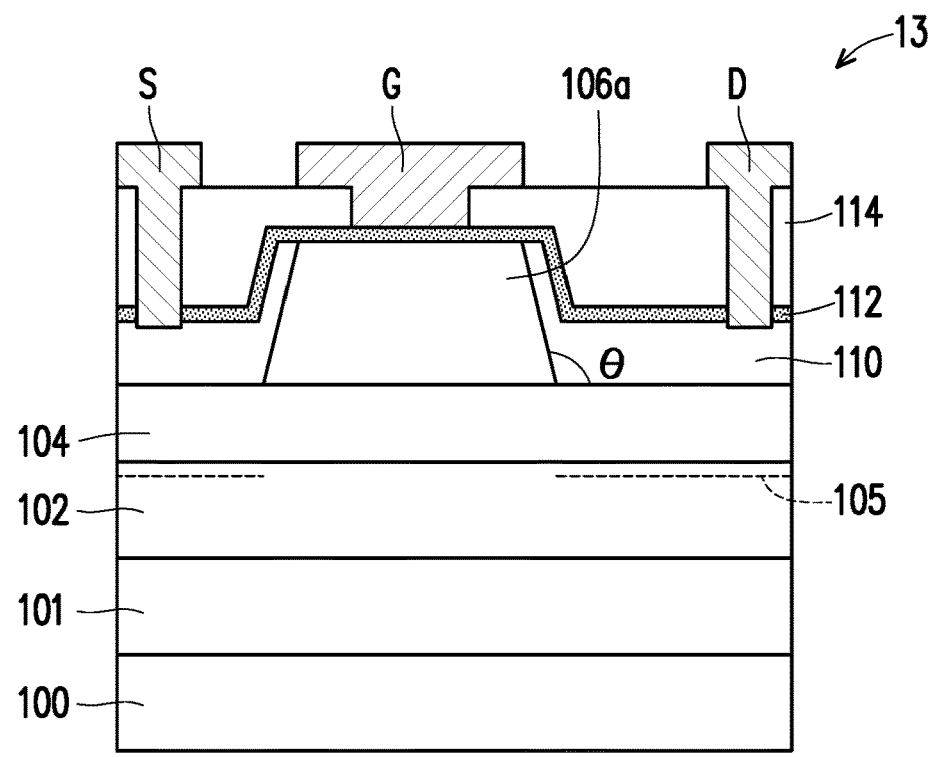

The enhancement mode HEMT device 13 in FIG. 4 is similar to the enhancement mode HEMT device 10 in FIG. 1F, and the difference between them lies in that, the barrier layer 104 of the enhancement mode HEMT device 10 in FIG. 1F is thicker at the center portion than at the edge portion thereof, while the barrier layer 104 of the enhancement mode HEMT device 13 in FIG. 4 has substantially the same thickness at the center and edge portions thereof. Specifically, in the pattern transferring process of the enhancement mode HEMT device 13 in FIG. 4, the pattern of the mask layer is merely transferred to the P-type semiconductor layer.

Figure 5:
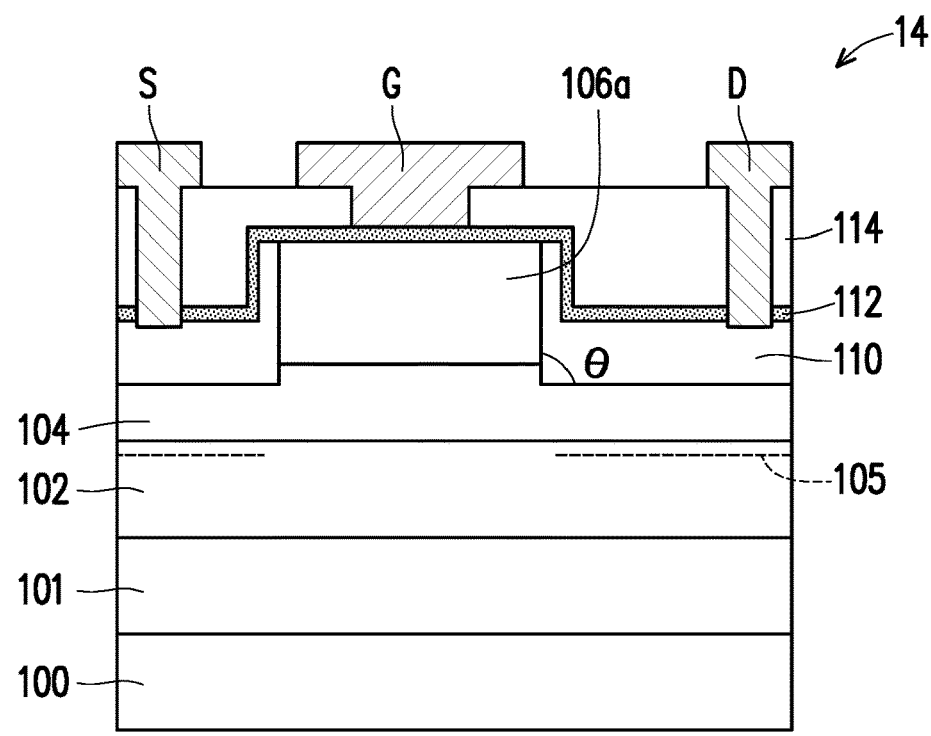

The enhancement mode HEMT device 14 in FIG. 5 is similar to the enhancement mode HEMT device 10 in FIG. 1F, and the difference between them lies in that, the P-type semiconductor layer 106a of the enhancement mode HEMT device 10 in FIG. 1F has an inclined sidewall, while the P-type semiconductor layer 106a of the enhancement mode HEMT device 14 in FIG. 5 has a substantially vertical sidewall. Specifically, as shown in the enhancement mode HEMT device 14 of FIG. 5, the angle θ between the sidewall of the P-type semiconductor layer 106a and the top of the barrier layer 104 is a right angle. For example, the angle θ can be about 90 degrees.

Figure 6:
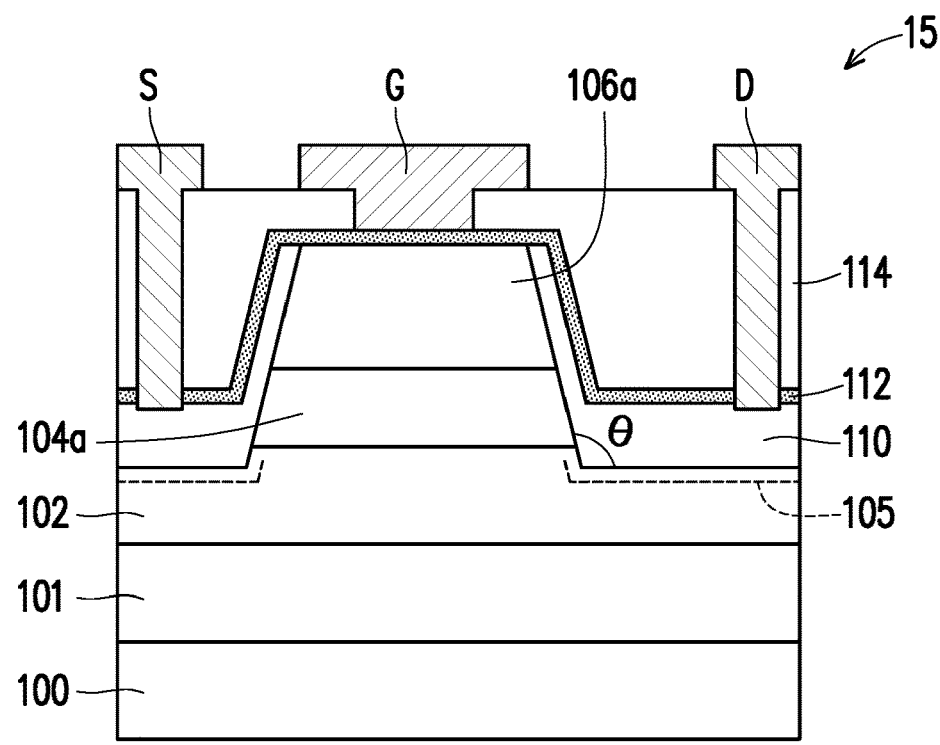

The enhancement mode HEMT device 15 in FIG. 6 is similar to the enhancement mode HEMT device 10 in FIG. 1F, and the difference between them lies in that, the carrier providing layer 110 of the enhancement mode HEMT device 10 in FIG. 1F is disposed on the sidewall of the P-type semiconductor layer 106a and extends outwardly on the barrier layer 104, while the carrier providing layer 110 of the enhancement mode HEMT device 15 in FIG. 6 is disposed on the sidewalls of the P-type semiconductor layer 106a and the barrier layer 104a and extends outwardly on the channel layer 102. In an embodiment, the carrier providing layer 110 is in physical contact with the channel layer 102. Specifically, in the pattern transferring process of FIG. 1C, the pattern of the mask layer is transferred to the P-type semiconductor layer, the barrier layer and a portion of the channel layer.

Figure 7:
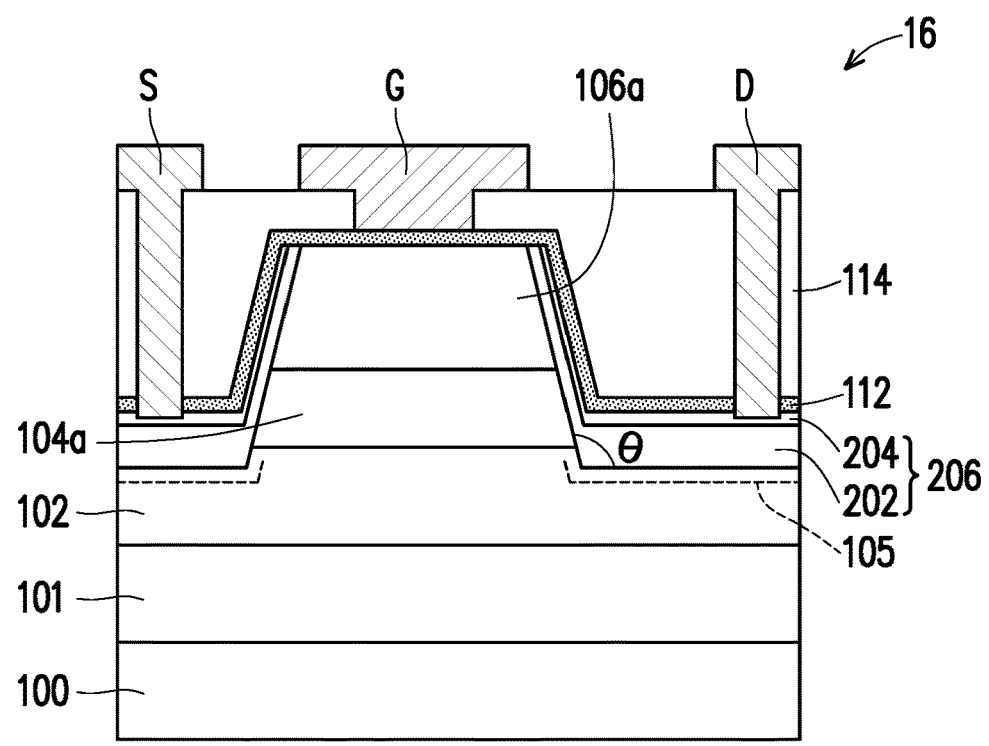

The enhancement mode HEMT device 16 in FIG. 7 is similar to the enhancement mode HEMT device 15 in FIG. 6, and the difference between them lies in that, the carrier providing layer 110 of the enhancement mode HEMT device 15 in FIG. 6 has a single-layer structure, while the carrier providing layer 206 of the enhancement mode HEMT device 16 in FIG. 7 has a dual-layer structure.

Figure 8:
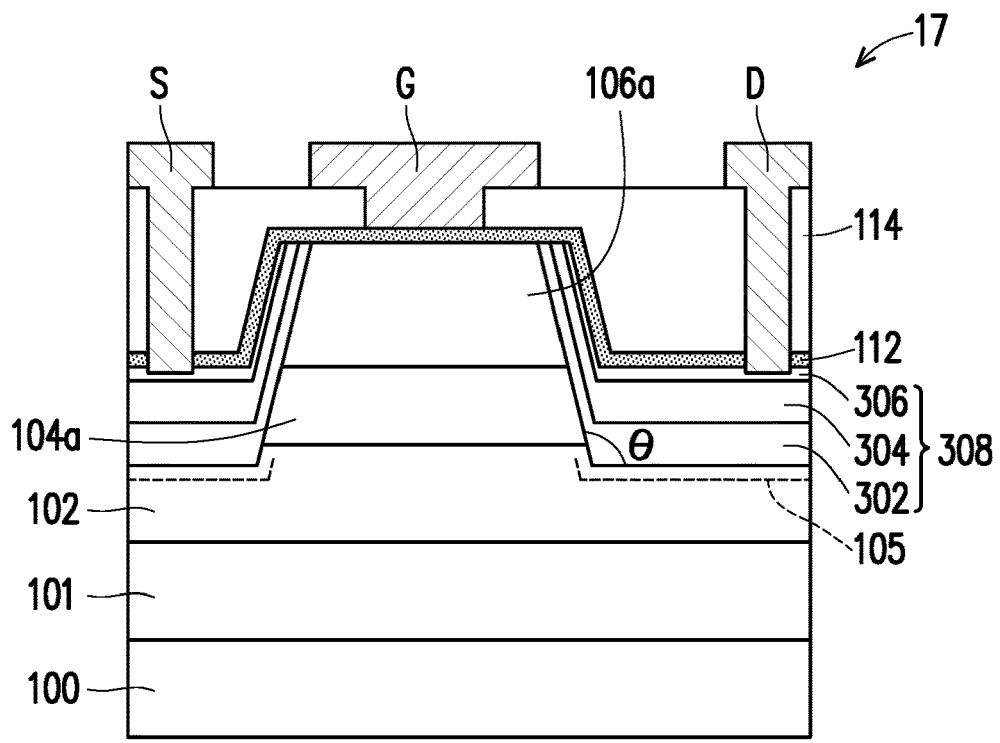

The enhancement mode HEMT device 17 in FIG. 8 is similar to the enhancement mode HEMT device 15 in FIG. 6, and the difference between them lies in that, the carrier providing layer 110 of the enhancement mode HEMT device 15 in FIG. 6 has a single-layer structure, while the carrier providing layer 308 of the enhancement mode HEMT device 17 in FIG. 8 has a tri-layer structure.

Figure 9:
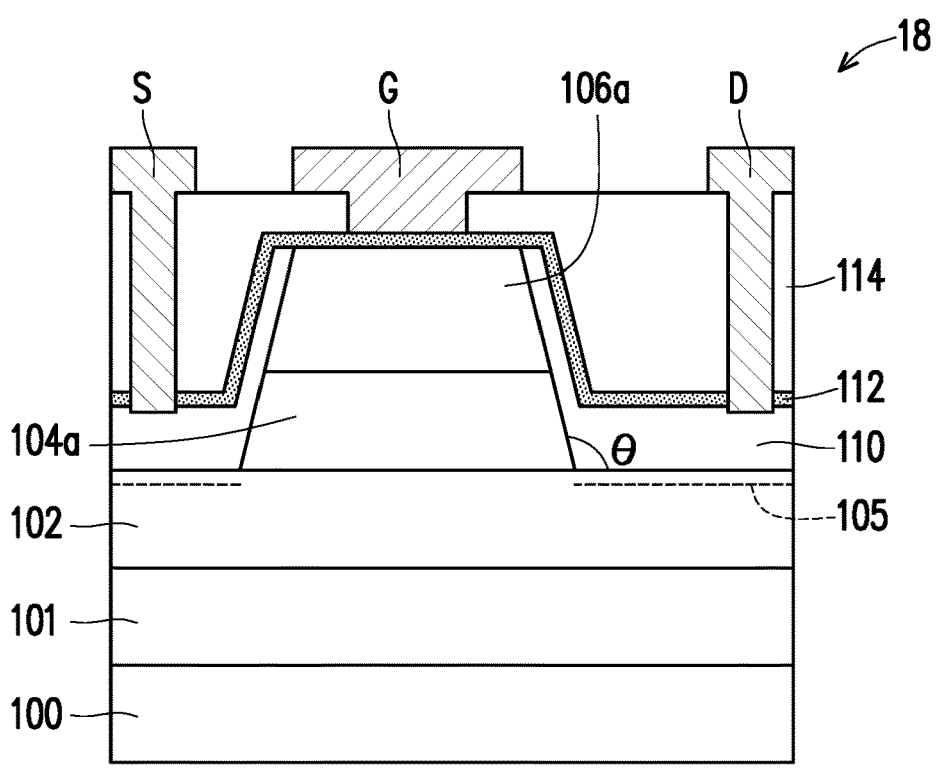

The enhancement mode HEMT device 18 in FIG. 9 is similar to the enhancement mode HEMT device 15 in FIG. 6, and the difference between them lies in that, the channel layer 102 of the enhancement mode HEMT device 15 in FIG. 6 is thicker at the center portion than at the edge portion thereof, while the channel layer 102 of the enhancement mode HEMT device 18 in FIG. 9 has substantially the same thickness at the center and edge portions thereof.

Figure 10:
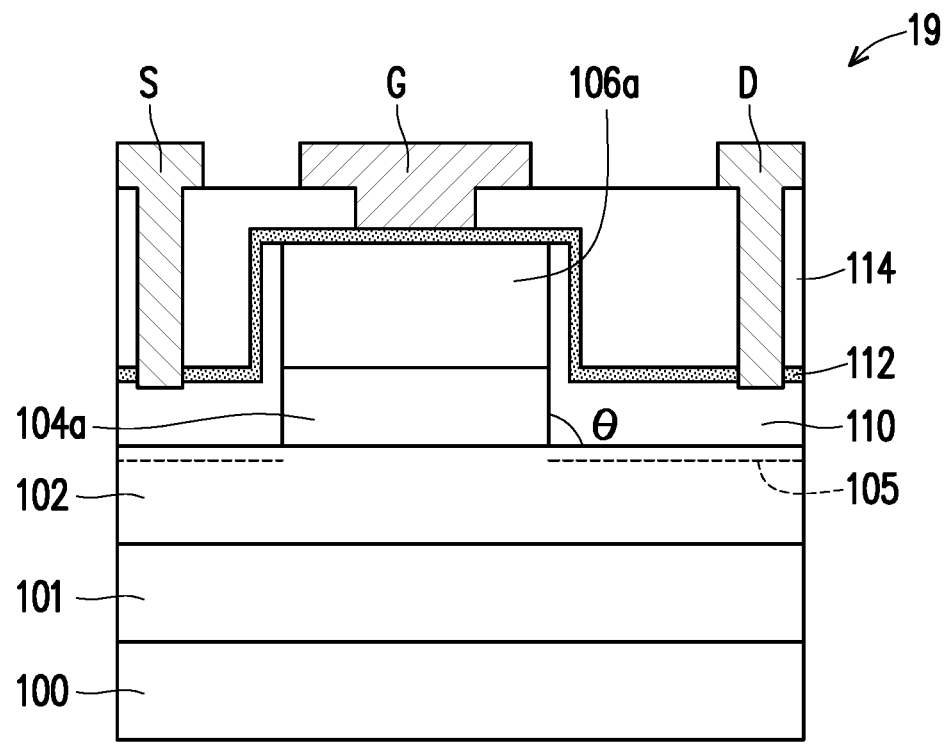

The enhancement mode HEMT device 19 in FIG. 10 is similar to the enhancement mode HEMT device 18 in FIG. 9, and the difference between them lies in that, the P-type semiconductor layer 106a of the enhancement mode HEMT device 18 in FIG. 9 has an inclined sidewall, while the P-type semiconductor layer 106a of the enhancement mode HEMT device 19 in FIG. 10 has a substantially vertical sidewall.

It is noted that, in the enhancement mode HEMT devices 15 to 17 of FIGS. 6 to 8, since the thickness of channel layer 102 is not uniform, the angle θ between the sidewall of the P-type semiconductor layer 106a and the top of the channel layer 102 must be an obtuse angle to enable the 2DEG 105 to form in the channel layer 102 along the corner of the carrier providing layer 110/206/308. On the other hand, in the enhancement mode HEMT devices 18 to 19 of FIGS. 9 to 10, since the thickness of the channel layer 102 is uniform, the angle θ between the sidewall of the P-type semiconductor layer 106a and the top of the channel layer 102 may be an obtuse angle or a right angle, both of which allow the 2DEG 105 to be formed below the interface between the barrier layer 104a and the channel layer 102.

In summary, in some embodiments of the invention, an epitaxial regrowth process of a carrier providing layer is performed in the region outside of the device intrinsic region or the gate region. This not only avoids the problem of non-uniform electric current and leakage current, but also increases the carrier concentration of the region outside of the gate region to resolve the problem of insufficient output current. Besides, the method of the invention has simple process steps and can greatly enhance the flexibility of the epitaxial growth and the device design.

The present invention has been disclosed above in the preferred embodiments, but is not limited to those. It is known to persons skilled in the art that some modifications and innovations may be made without departing from the spirit and scope of the present invention. Therefore, the scope of the present invention should be defined by the following claims.

What is claimed is:

1. An enhancement mode high electron mobility transistor (HEMT) device, comprising:
    a channel layer, disposed on a substrate;
    a barrier layer, disposed on the channel layer;
    a P-type semiconductor layer, disposed on the barrier layer;
    a carrier providing layer, disposed on a sidewall of the P-type semiconductor layer and extends laterally away from the P-type semiconductor layer;
    a gate electrode, disposed on the P-type semiconductor layer; and
    a source electrode and a drain electrode, disposed on the carrier providing layer and at a first side of the gate electrode and a second side of the gate electrode opposite to the first side of the gate electrode,
    wherein the carrier providing layer is in contact with the barrier layer.

2. The enhancement mode HEMT device of claim 1, wherein an aluminum content of the carrier providing layer is greater than an aluminum content of the barrier layer.

3. The enhancement mode HEMT device of claim 1, wherein the carrier providing layer has a single-layer structure.

4. The enhancement mode HEMT device of claim 1 wherein the carrier providing layer has a multi-layer structure, and an aluminum content of the carrier providing layer is gradually reduced away from the channel layer.

5. The enhancement mode HEMT device of claim 1, wherein the carrier providing layer is adjacent to the barrier layer.

6. The enhancement mode HEMT device of claim 1, wherein a thickness of the carrier providing layer on the sidewall of the P-type semiconductor layer is less than a thickness of the carrier providing layer on a top of the barrier layer.

7. The enhancement mode HEMT device of claim 1, further comprising a dielectric layer disposed on the carrier providing layer and between the gate electrode and the P-type semiconductor layer.

8. The enhancement mode HEMT device of claim 1, wherein a thickness of the barrier layer below the P-type semiconductor layer is greater than a thickness of the barrier layer at a first side of the P-type semiconductor layer and a second side of the P-type semiconductor layer opposite to the first side of the P-type semiconductor layer.

9. The enhancement mode HEMT device of claim 1, wherein the P-type semiconductor layer has an inclined sidewall.

10. The enhancement mode HEMT device of claim 1, wherein the P-type semiconductor layer has a substantially vertical sidewall.

11. The enhancement mode HEMT device of claim 1, wherein the carrier providing layer is in contact with the channel layer.

12. The enhancement mode HEMT device deCclaivice of claim 11, wherein a thickness of the channel layer below the barrier layer is greater than a thickness of the channel layer at a first side of the barrier layer and a second side of the barrier layer opposite to the first side of the barrier layer.

13. The enhancement mode HEMT device of claim 11, wherein the P-type semiconductor layer has an inclined sidewall.

14. A method of forming an enhancement mode high electron mobility transistor (HEMT) device, comprising:
    sequentially forming a channel layer, a barrier layer and a P-type semiconductor layer on a substrate;
    forming a mask layer on the P-type semiconductor layer;
    transferring a pattern of the mask layer to the P-type semiconductor layer;
    forming a carrier providing layer on the substrate, wherein the carrier providing layer covers a sidewall of the P-type semiconductor layer;
    forming a source electrode and a drain electrode at a first side of the P-type semiconductor layer and a second side of the P-type semiconductor layer opposite to the first side of the P-type semiconductor layer; and
    forming a gate electrode on the P-type semiconductor layer.

15. The method of claim 14, wherein the pattern of the mask layer is further transferred to a portion of the barrier layer.

16. The method of claim 14, wherein the pattern of the mask layer is further transferred to the barrier layer and a portion of the channel layer.

17. The method of claim 14, wherein a method of forming the carrier providing layer comprises performing an epitaxial regrowth process.

18. The method of claim 14, wherein an aluminum content of the carrier providing layer is greater than an aluminum content of the barrier layer.

19. The method of claim 14, further comprising forming a dielectric layer before forming the source electrode and the drain electrode and after forming the carrier providing layer.

* * * * *